United States Patent [19]

Kaede et al.

[11] Patent Number: 4,669,086
[45] Date of Patent: May 26, 1987

[54] FREQUENCY-STABILIZED SEMICONDUCTOR LASER OSCILLATOR

[75] Inventors: Kazuhisa Kaede; Hiroyoshi Rangu, both of Tokyo, Japan

[73] Assignee: NEC Corporation, Tokyo, Japan

[21] Appl. No.: 598,199

[22] Filed: Apr. 9, 1984

[30] Foreign Application Priority Data

Apr. 11, 1983 [JP] Japan ................................ 58-63182

[51] Int. Cl.⁴ ........................................ H01S 3/096
[52] U.S. Cl. ........................................ 372/32; 372/50
[58] Field of Search ..................... 372/32, 29, 50, 26

[56] References Cited

U.S. PATENT DOCUMENTS 4,503,541  3/1985  Weller et al. ................... 372/92

FOREIGN PATENT DOCUMENTS 0046588  4/1981  Japan ................................ 372/50
0111383  6/1984  Japan ................................ 372/32

OTHER PUBLICATIONS

K. R. Preston, "Simple Spectral Control Technique for External Cavity Laser Transmitters", *Electronics Letters* Dec. 9, 1982, vol. 18, No. 25, pp. 1092-1094.
F. K. Reinhart et al, "Integrated Electro-Optic . . . Laser", *Applied Physics Letters,* vol. 27, No. 10, (Nov. 15, 1975), pp. 532-534.
I. Mito et al, "InGaAsP . . . Confinement", *Journal of Lightwave Technology,* vol. Lt-1, No. 1 (Mar. 1983), pp. 195-201.

*Primary Examiner*—James W. Davie
*Attorney, Agent, or Firm*—Schwartz, Jeffery, Schwaab, Mack, Blumenthal & Evans

[57] ABSTRACT

A frequency-stabilized semiconductor laser oscillator in which a control signal derived from a modulation signal is applied to a second optical waveguide adjacent the first optical waveguide in order to make the overall optical path between both waveguides constant despite variations in the refractive index of the optical path in the first optical waveguide. The control signal may be a current signal derived by shifting the phase of the variation of the current of the modulation signal with respect to time, or a voltage signal derived by shifting the phase of the variation of the voltage of the modulation signal with respect to time. If a current control signal is used, the compensation mechanism is an increase in the carrier density in a second optical waveguide. If a voltage control signal is used, the compensation mechanism is an electro-optic variation of the refractive index in the second optical waveguide.

5 Claims, 16 Drawing Figures

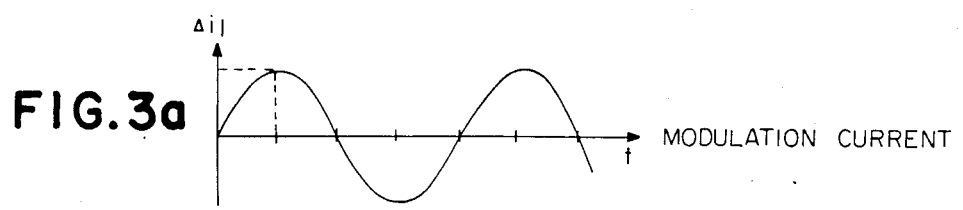
FIG. 3a — MODULATION CURRENT
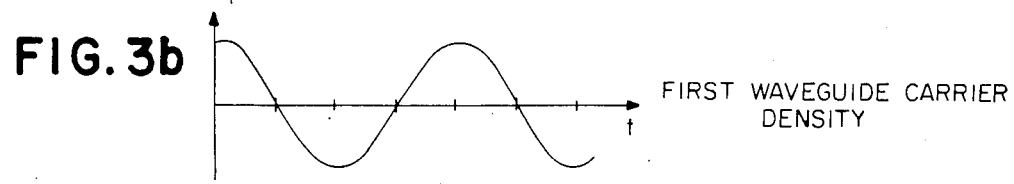
FIG. 3b — FIRST WAVEGUIDE CARRIER DENSITY
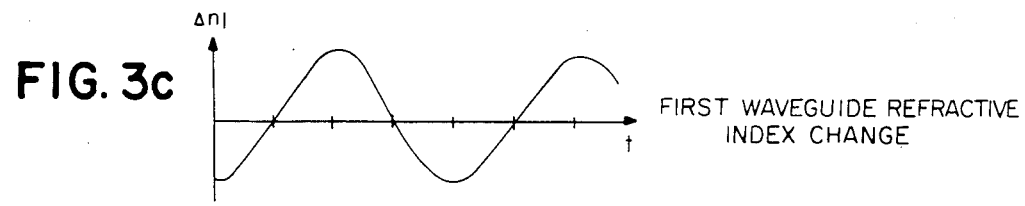
FIG. 3c — FIRST WAVEGUIDE REFRACTIVE INDEX CHANGE
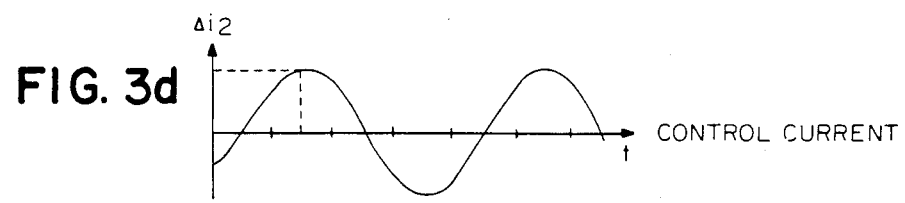
FIG. 3d — CONTROL CURRENT
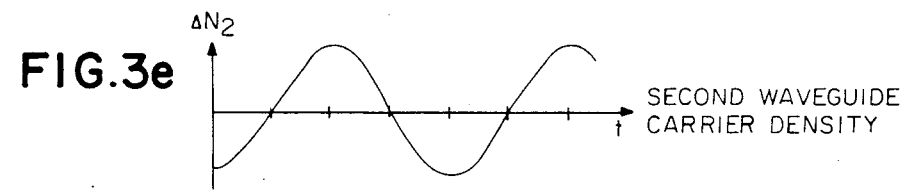
FIG. 3e — SECOND WAVEGUIDE CARRIER DENSITY
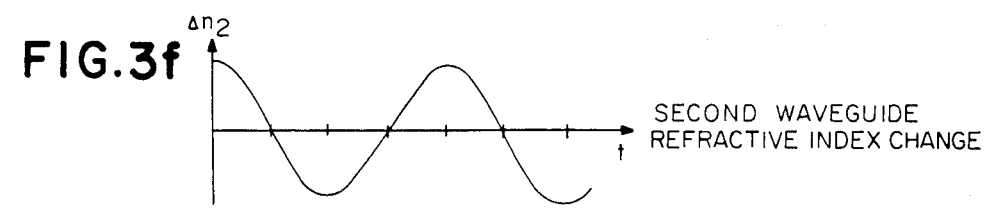
FIG. 3f — SECOND WAVEGUIDE REFRACTIVE INDEX CHANGE

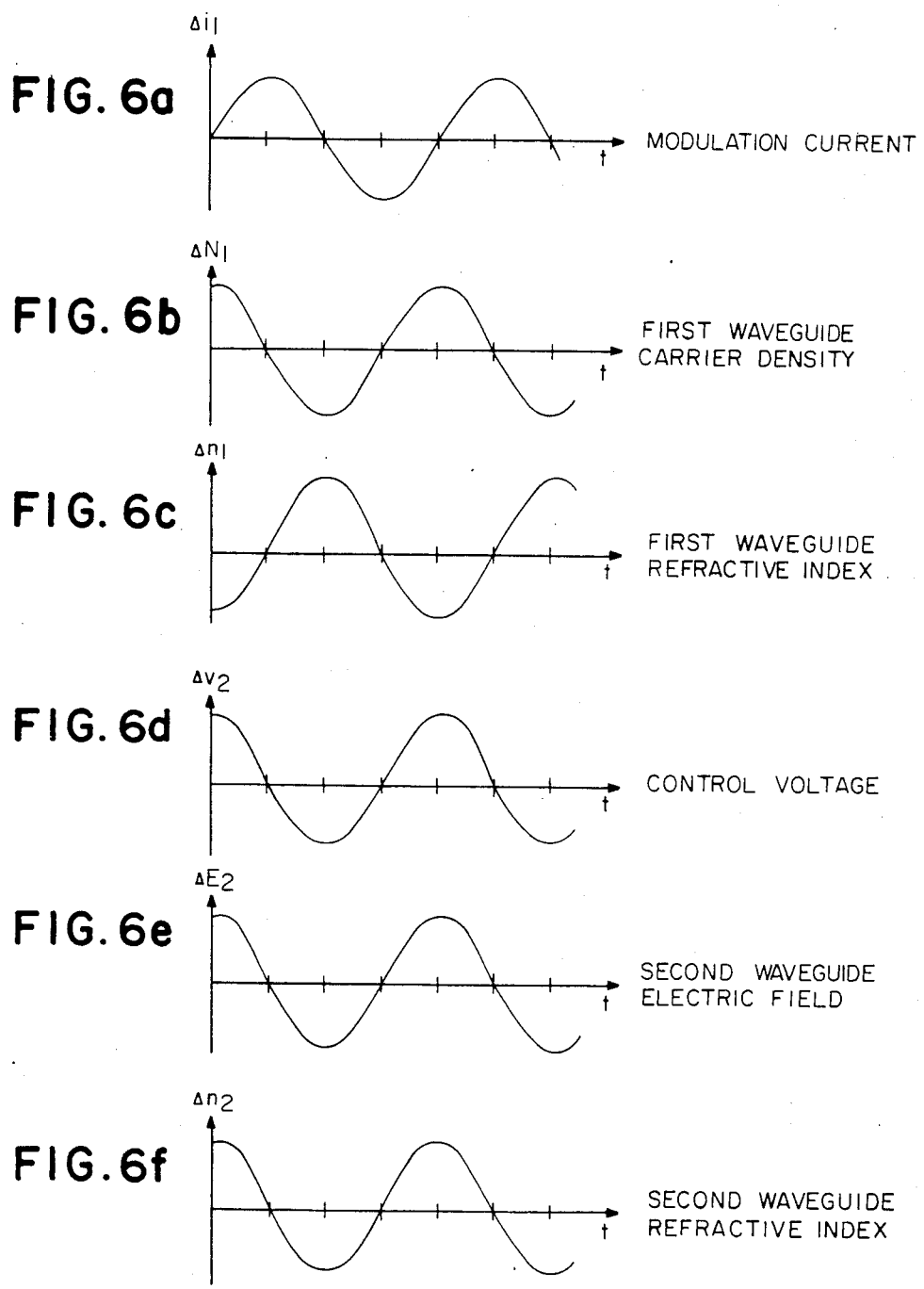

FREQUENCY-STABILIZED SEMICONDUCTOR LASER OSCILLATOR

BACKGROUND OF THE INVENTION

The present invention relates to a semiconductor laser diode, and more particularly to the oscillation frequency stabilization of the semiconductor laser diode.

In accordance with recent remarkable improvements in semiconductor laser diode and optical fiber technologies, studies have been conducted on an analog transmission system with direct intensity modulation of the semiconductor laser output. However, due to the coherency of laser output which is intrinsic in the laser output itself and the dispersion of modes in optical fibers, speckle patterns are produced in optical fibers. As such speckle patterns are caused to fluctuate in optical fibers by the chirping of oscillation frequencies at current modulation, "modal noise" is often produced and presents a problem in fiber optic analog transmission systems. In order to achieve a high quality fiber optic analog transmission, stabilization of laser diode oscillation frequency is keenly desired.

Conventionally semiconductor laser diodes fabricated by forming a Fabry-Perot resonator with two cleavage planes, have been used. Electric current is pumped into an active layer sandwiched between a p-type semiconductor layer and an n-type semiconductor layer from two electrodes of a p-type and an n-type, and amplifying light is emitted in the active layer to obtain laser output. However, these semiconductor lasers are defective in that when the concentration of free carriers which are injected into the active layer is changed in order to intensity-modulate the laser output, the optical length of the resonator changes. This is due to the changes in the active layer refractive index which is dependent on the carrier density through free carrier plasma effect and band-to-band optical transitions. In addition, variation of the injected current produces active layer temperature changes, which also results in the refractive index variation. These refractive index variation cause oscillation frequency fluctuation.

SUMMARY OF THE INVENTION

An object of this invention is to eliminate the aforementioned defects and to provide a semiconductor laser device which will not substantially fluctuate its oscillation frequencies even if the number of carrier electrons to be injected into the active layer is varied.

The semiconductor laser device according to this invention comprises a semiconductor laser diode comprising a first optical waveguide layer section, a first electrode for injecting electric current to the first optical waveguide layer section, a second optical waveguide layer section which is connected to the first optical waveguide layer section and has a controllable refractive index. A second electrode is provided which applies a control signal for controlling the refractive index of the second optical waveguide layer section, and an electric circuit which applies modulation signals to the first electrode is also employed in order to modulate optical output from the semiconductor laser diode. The electric circuit also applies the second electrode with control signals having a predetermined proportionate relation in amplitude and a predetermined phase difference with the modulation signals for every frequency.

Accordingly changes in the active layer refractive index are produced due to the variation in the concentration of free carriers which are injected into the active layer, and due to that in the active layer temperature when the laser output intensity is modulated with modulation signals, and, hence the optical length is inevitably changed in the active layer. Despite these phenomena, the optical length of the resonator as a whole can be maintained at a given value, because the optical length of the optical waveguide layer connected to the active layer is controlled with a control signal applied to a second electrode, thereby changing the refractive index of the optical waveguide layer. Thus, the oscillation frequency can be effectively stabilized.

BRIEF DESCRIPTION OF THE DRAWINGS

FIGS. 3a through 3f relate to the first embodiment of this invention to respectively show the chronological changes in the modulation signal current, the free carrier concentration of the first optical waveguide layer section, the refractive index of the first optical waveguide layer section, the control signal current, the free carrier concentration of the second optical waveguide layer and the refractive index of the second optical waveguide layer.

FIGS. 6a through 6f relate to the second embodiment and show respectively the chronological changes in the modulation signal current, the free carrier concentration of the first optical waveguide layer section, the refractive index of the first optical waveguide layer section, the control signal voltage, the electric field intensity of the second optical waveguide layer section, and the refractive index of the second optical waveguide layer section.

DETAILED DESCRIPTION OF THE PREFERRED EMBODIMENTS

Figure 1:
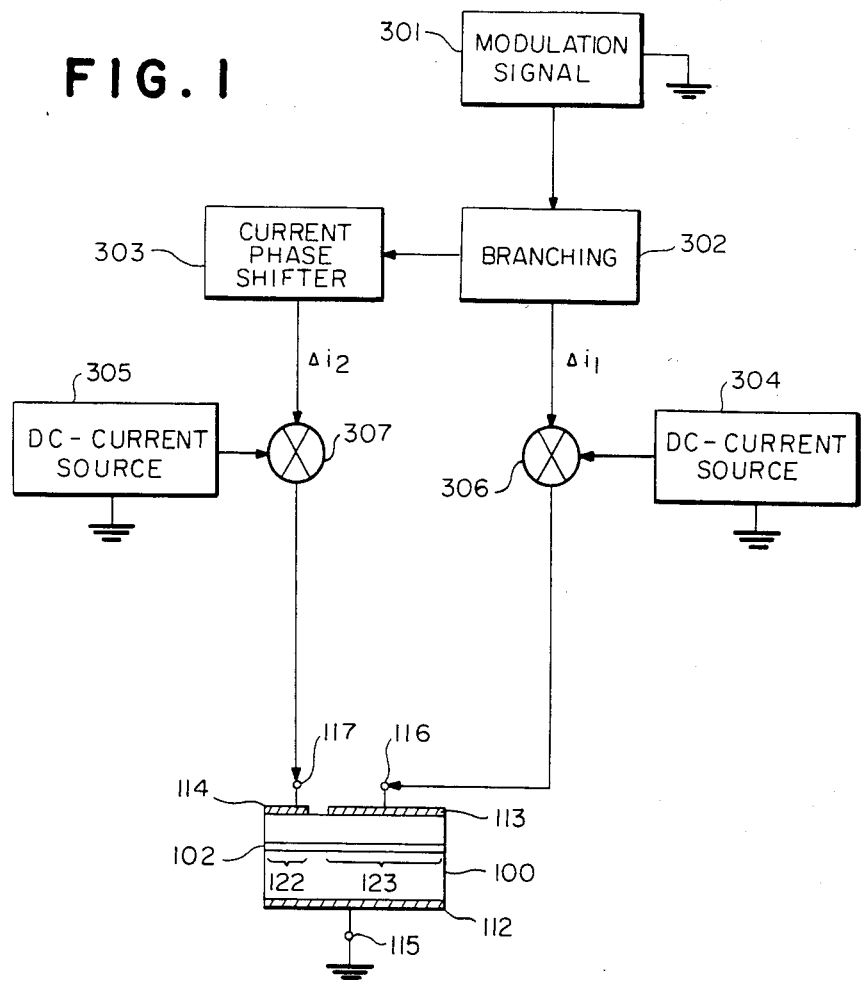
FIG. 1 is a block diagram to show the first embodiment of this invention.

The first embodiment of this invention shown in FIG. 1 includes a semiconductor laser diode 100, a modulation signal source 301, a branching circuit 302, a current phase shifter 303, a first DC-current source 304, a second DC-current source 305, a first mixer 306, and a second mixer 307. The semiconductor laser element 100 includes a first optical waveguide layer section 123 and a second waveguide layer section 122 which comprise an optical resonant path. Each optical waveguide section is applied with AC signals supplied and superposed on DC signals from sources respectively connected to the first and the second electrodes 113, 114. The semiconductor laser diode 100 will be described in more detail hereinafter referring to FIG. 3.

The modulation signal current generated at the modulation signal source 301 is divided by the branching circuit 302 into two currents. In other words, the sinusoidal modulating current generated at the modulation signal source 301 which is 100 MHz in modulation frequency is divided by the branching circuit 302 into two currents: i.e. 10 mA$_{p-p}$ modulation signal current, $\Delta i_1$ fed to the first mixer 306 and 0.4 mA$_{p-p}$ control signal current $\Delta i_2$ fed to the second mixer 307 via the current phase shifter 303. The modulation current $\Delta i_1$ which has been branched to the first mixer 306 is mixed with a DC current of 35 mA which is supplied from the first DC power source 304 at the mixer 306 and then injected into the semiconductor laser diode 100 via a first terminal 116. The current $\Delta i_2$ of 0.4 mA$_{p-p}$ which has been branched out to the second mixer 307 via the phase shifter 303 is given a phase delay of about 45° by the phase shifter, mixed with a DC current of 1 mA supplied from the second DC power source 305 at the second mixer 307 and then injected into the semiconductor laser diode 100 as a control current via a second terminal 117.

Figure 2:
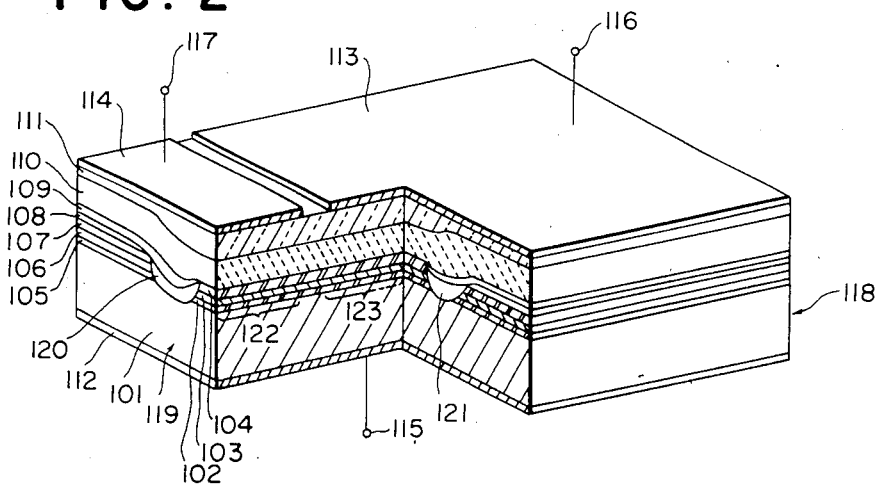
FIG. 2 is a partially exploded perspective view of a semiconductor laser diode to be used in the first embodiment of this invention.

FIG. 2 is a perspective view of a semiconductor laser diode used in the first embodiment according to this invention which is partially cut away to show its cross section. The semiconductor laser diode used in the first embodiment includes an n-type InP substrate 101, a non-doped InGaAsP active layer 102, a p-type InGaAsP guide layer 103, a p-type InP cladding layer 104, a non-doped InGaAsP first blocking layer 105, a p-type InGaAsP second blocking layer 106, a p-type InP third blocking layer 107, a p-type InP fourth blocking layer 108, an n-type InP fifth blocking layer 109, a p-type InP embedding layer 110, a p-type InGaAsP cap layer 111, an Au-Ge common electrode 112, an Au-Zn first electrode 113, an Au-Zn second electrode 114, a terminal 115 connected to the common electrode, a first terminal 116 connected to the first electrode 113, and a second terminal 117 connected to the second electrode 114. One region of the active layer 102 and the guide layer 103 just below the first electrode 113 comprises the first optical waveguide section 123 while the other region of the active layer 102 and the guide layer 103 just below the second electrode 114 comprises a second optical waveguide section 122.

The active layer 102 is about 0.1 micron in thickness and the band gap thereof is 1.3 microns in wavelength while the guide layer 103 is about 0.2 micron in thickness and the band gap thereof is 1.2 microns in wavelength. The stripe width in the active layer 102 and the guide layer 103 is about 1.5 microns while the length thereof is about 300 microns. The lengths of the first electrode 113 and the second electrode 114 are respectively about 270 microns and about 20 microns in the direction of the stripe of the active layer. The distance between electrodes is about 10 microns.

When the active layer 102 is injected with electric current through the first electrode 113 and the common electrode 112, laser oscillation occurs by the Fabry-Perot resonator which is comprised of the first and the second cleavage planes 118 and 119. If a modulation signal current $\Delta i_1$ is applied to the first electrode 113 in order to modulate the intensity of the laser output, concentration of the carrier electrons in the active layer 102 in the first optical waveguide section 122 changes the carrier-density-dependent refractive index. This makes the optical length of the first optical waveguide section 122 change. On the other hand, the second electrode 114 is applied with a control signal current $\Delta i_2$ which is adapted to vary corresponding to the changes in the modulation signals. This makes the free carrier electron concentration in the second optical waveguide section change. The refractive index in the active layer of the second optical waveguide section 123 changes by an amount which compensates the change in resonator length which would be caused by the change in the refractive index of the active layer in the first optical waveguide section 122. The resonator length as a whole, therefore, can be maintained constant.

Referring also to FIGS. 3a through 3f, the operation will be described in more detail.

The first electrode 113 is applied with a 35 mA DC bias current, and sinusoidal modulating signal current $\Delta i_1$ having a modulation frequency of 100 MHz and a peak-to-peak value of about 10 mA as shown in FIG. 3a. As shown in FIG. 3b, at this time, the carrier concentration change $\Delta N_1$ of the active layer of the first optical waveguide section 122 will occur in a manner to make the carrier concentration maximum at a phase which is advanced by about 90° from the phase where the modulation signal current $\Delta i_1$ reaches its peak. Substantially following the pattern of the carrier concentration change, as shown in FIG. 3c, the refractive index of the first optical waveguide section will change in manner to make the refractive index minimum at a phase where the carrier concentration reaches its peak. The refractive index change $\Delta n_1$ at the first optical waveguide section is about $10^{-5}$ at maximum and the refractive index becomes the largest at the phase which is delayed by about 90° from the phase where the modulation signal current $\Delta i_1$ reaches its peak.

As a control signal, a control signal current having frequency of 100 MHz and peak-to-peak value of about 0.4 mA is applied to the second electrode 114 at a phase delayed by about 45° from said modulation signal current $\Delta i_1$ together with a DC bias current of about 1 mA. In this case, the density of the DC bias current applied to the second electrode 114 is kept below the level of lasing threshold current density. The change $\Delta N_2$ in the carrier concentration of the active layer of the second optical waveguide section occurs at the phase advanced by about 135° from the phase of the control signal current $\Delta i_2$.

The phase difference between the current $\Delta i_2$ and the carrier concentration change $\Delta N_2$ in the second optical waveguide section differs from the phase difference between the current $\Delta i_1$ and the carrier concentration change $\Delta N_1$ in the first optical waveguide section because almost no stimulated emission occurs in the second optical waveguide section due to the fact that the density of DC bias current is kept below the lasing threshold level.

The maximum value of the refractive index change $\Delta n_2$ at the second optical waveguide section is larger than the maximum value of the refractive index change $\Delta n_1$ at the first optical waveguide section by a ratio of approximately 1:13.5. This ratio corresponds to the ratio of the length of the first optical waveguide section to the length of the second optical waveguide section, thereby making the optical length change in each section equal. The changes in optical lengths in the first optical waveguide section and the second optical waveguide section counterbalance each other by the relation in the intensity and the phase in the modulation signal current $\Delta i_1$ and the control signal current $\Delta i_2$ so as to maintain the resonator length as a whole substantially at a constant value.

A brief description will now be given of the fabrication method of the semiconductor laser diode shown in FIG. 2. Referring to FIG. 2, an n-type InP substrate 101 having (001) on the surface is first prepared. Then, by the liquid-phase epitaxial growth method, an active layer 102 of non-doped $In_{1-x1}Ga_{x1}As_{1-y1}P_{y1}$ ($x_1=0.28$, $y_1=0.61$), a guide layer 103 of p-type $In_{1-x2}As_{1-y2}P_{y2}$ ($x_2=0.22$, $y_2=0.48$) of impurity concentration of $5\times10^{17}$ cm$^{-3}$ and a cladding layer 104 of p-type InP of impurity concentration of $1\times10^{18}$ cm$^{-3}$ are sequentially grown on the substrate. Because the grooves 120, 121 are not yet formed on both sides of the active layer 102, the first block layer 105, the active layer 102, the second block layer 106, the guide layer 103, the third block layer 107 and the cladding layer 104 are respectively grown simultaneously as a layer. By using a photoresist as a mask, two grooves 5 microns in width 120, 121 are etched at an interval of about 1.5 microns respectively. These grooves 120, 121 reach in depth into the InP substrate 101. Then, the photoresist is removed, and the fourth block layer 108 of p-type InP having impurity concentration of $1\times10^{18}$ cm$^{-3}$, the fifth block layer 109 of n-type InP of impurity concentration of $1\times10^{18}$ cm$^{-3}$, an embedding layer 110 of p-type InP of impurity concentration of $1\times10^{18}$ cm$^{-3}$, and a cap layer 111 of p-type $In_{1-x3}Ga_{x3}As_{1-y3}P_{y3}$ ($x_3=0.22$, $y_3=0.48$) of impurity concentration of $1\times10^{19}$ cm$^{-3}$ are consecutively grown. The fourth and the fifth blocking layers 108, 109 are grown in a manner not to extend over the cladding layer 104. Lastly, electrodes 112–114 are formed.

A laser diode of this structure is unique and different from conventional laser diodes in that the first electrode 113 and the second electrode are electrically isolated so that each electrode may be able to independently inject current into the respective optical waveguide sections. The conventional structure of laser diodes are disclosed in, for example, Journal of Lightwave Technology, Vol. LT-1, No. 1, 1983, pp. 195–202, by Ikuo Mito et al.

Although the material for the semiconductor laser diode used in the first embodiment is disclosed as an InGaAsP system, it is by no means limited to that and may be comprised of other compositions such as an AlGaAs system. The layer structure of the first and the second optical waveguide sections are described to be identical in above example, but they may be different in the thickness or composition ratio. Although the modulation frequency of the modulation signal source is 100 MHz in the first embodiment, it is not limited to this value. It may be another frequency or may include multiple and continuous frequency components. In such a case, the phase shift by the phase shifter is not limited to about 45° but may be an appropriate value for each frequency. In the case where the modulation frequency component includes resonance frequency in the modulation response characteristics of the semiconductor laser diode, the changes in the refractive index on the particular frequency becomes dominant. Therefore, the oscillation frequency can be sufficiently stabilized simply by making the phase shift of the phase shifter optimal only with respect to the control signal of the resonance frequency.

Although the above explanation relates to the refractive index change caused by the carrier density change, it is also applicable to the refractive index change owing to thermal effects.

The first embodiment has the following advantages: As the first and the second electrodes both are biased in the forward direction, isolation between both electrodes can be obtained relatively easily. As the semiconductor laser used in the above embodiments can be fabricated in the process similar to that of Fabry-Perot type semiconductor laser which are widely used except for electrodes, fabrication is simple.

Figure 4:
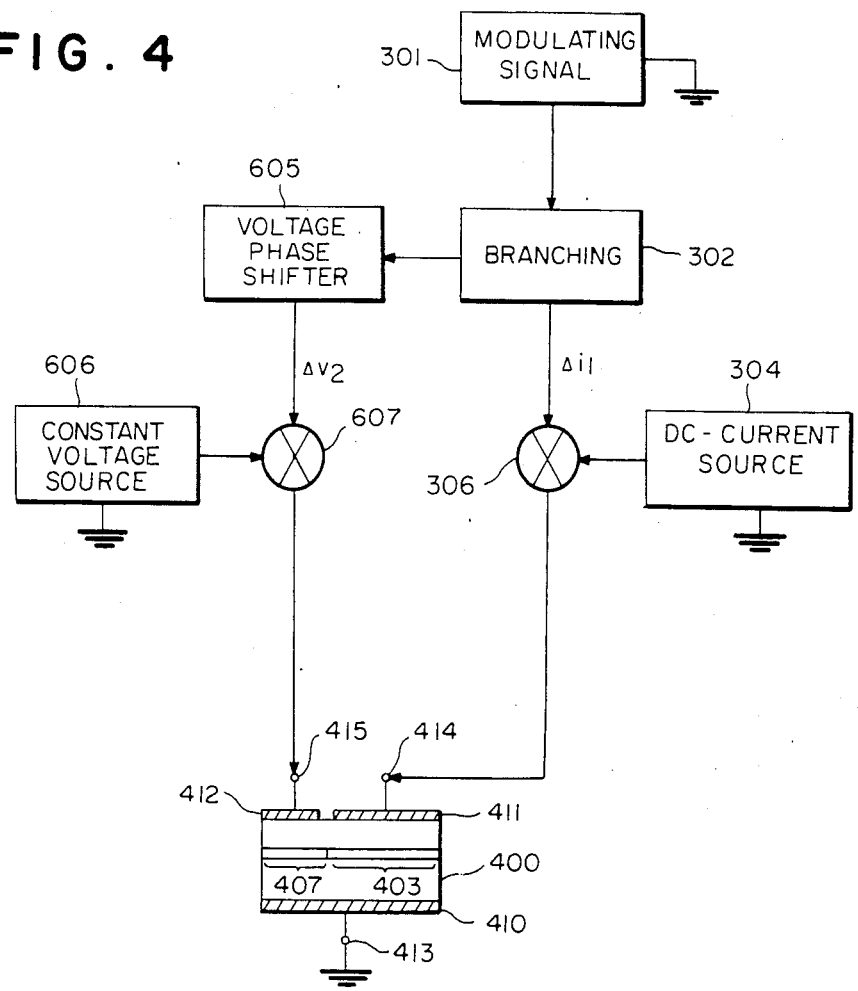
FIG. 4 is a block diagram of the second embodiment of this invention.

In FIG. 4, the semiconductor laser diode used in the second embodiment is distinguished from the first embodiment shown in FIG. 1 in that it has a voltage phase shifter 605, a constant voltage source 606, a voltage mixer 607 and a semiconductor laser element 400. The reference numerals identical to FIG. 1 are omitted in this description. The semiconductor laser diode comprises the first optical waveguide section 403 and the second optical waveguide section 407 which are arranged in the same direction, and the first electrode 411 and the second electrode 412 which are formed along the oscillation path on respective optical waveguide sections in a manner electrically insulated from each other. The first electrode 411 is connected to a mixer 306 via a terminal 414 and is fed with the modulation signal. The second electrode 412 on the other hand, is supplied with voltage from a mixer 607 via a terminal 415. The second electrode is applied with a voltage which makes the p-n junction in the second optical waveguide section reverse biased.

The modulation signal has a frequency of 100 MHz which is generated by the modulation signal source 601 and is divided into a first and second current. The first current is the modulation current and is fed to the first mixing circuit 306. The modulation current about 10 mA peak-to-peak. The second current is fed to a phase shifter 605 as a control signal voltage of about 3 volts peak-to-peak. The modulation current which has been branched to the first mixer 306 is mixed in the first mixing circuit 306 with a DC bias current of 35 mA supplied from a DC current source 604 and injected into the first terminal of the semiconductor laser 400. The control signal voltage is phase-adjusted so that it reaches its peak at the phase about 90° advanced from the peak of the modulation current. Then, it is mixed with a constant voltage of about 2 volts fed from a constant voltage power source and applied to the second electrode 415 of the semiconductor laser 400.

Figure 5:
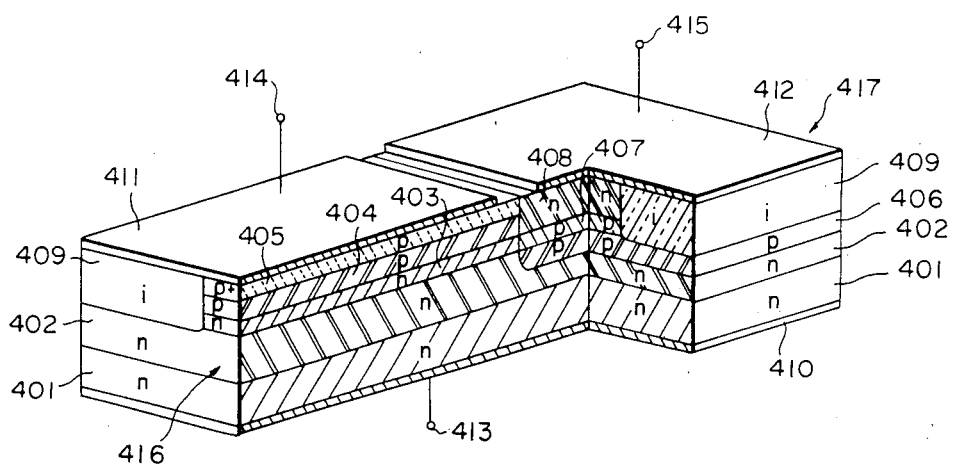
FIG. 5 is a partially exploded perspective view of a semiconductor laser diode to be used in the second embodiment of this invention.

In FIG. 5, the reference numeral 401 denotes an n-type GaAs substrate, 402 a first cladding layer of n-type AlGaAs, 403 a first optical waveguide section of non-doped n-type GaAs which functions as an active layer, 404 a second cladding layer of p-type AlGaAs, 405 a contact layer of p$^+$-type GaAs, 406 a third cladding layer of p-type AlGaAs, 407 a second optical waveguide section of p-type GaAs, 408 a fourth cladding layer of n-type AlGaAs, 409 an embedding layer of AlGaAs with high-resistance, 410 a common electrode of Au-Ge, 411 a first electrode for laser of Au-Zn, 412 a second electrode which applies a reverse bias voltage to the P-N junction on the boundary between the optical waveguide section 407 and the fourth cladding layer 409, 413 a terminal connected to the common electrode 410, 414 a first terminal connected to the first electrode 411, and 415 a second terminal connected to the second electrode.

The thickness of the first and the second optical waveguide sections is about 0.15 micron, and the width of the portions of these layers sandwiched between the embedding layers 409 is about 1.5 microns. The length of the first optical waveguide section 403 is about 200 microns and that of the second section 407 is about 50 microns.

The substrate 401 is of (001) in crystal orientation on the substrate surface and the direction of stripes of the first and the second optical waveguide section 403, 407 is for <011>. The impurity concentration of the third cladding layer 406 is $2 \times 10^{18}$ cm$^{-3}$, that of the second optical waveguide section 407 is $1 \times 10^{16}$ cm$^{-3}$, and that of the fourth cladding layer 408 is $2 \times 10^{18}$ cm$^{-3}$. The edge of the first electrode 411 on the side of the second electrode 412 is located about 10 microns apart from the boundary between the contact layer 405 and the fourth cladding layer 408 while the edge of the second electrode 412 on the first electrode 411 is located about 5 microns apart from the boundary between the contact layer 405 and the fourth cladding layer 408.

When electric current is injected into the first optical waveguide section 403 which is an active layer via the first electrode 411 and the common electrode 410, laser oscillation occurs by the Fabry-Perot resonator comprising two reflecting surfaces of the first cleavage plane 416 and the second cleavage plane 417.

As the injection current is modulated in order to modulate the intensity of the laser output, the free carrier concentration within the active layer or the first optical waveguide layer 403 changes. This in turn alters the refractive index, to thereby change the optical length of the Fabry-Perot resonator. In order to compensate for the change in the resonator's optical length, the electric field intensity and the thickness of the depletion layer, generated in the vicinity of the P-N junction on the boundary between the second optical waveguide section 407 and the fourth cladding layer 408, is changed by varying the reverse bias voltage which is to be applied to the P-N junction via the second electrode 412 and the common electrode 410 in correspondence with the injection current and applying the reverse bias voltage thereto. This causes a change in refractive index of the second optical waveguide section 407 attributable to the change in refractive index due to the electro-optic effect as well as the change in refractive index due to the thickness change in the depletion layer region where free carriers are sparsely populated. Accordingly, the changes in refractive index in the first optical waveguide section 403 caused by varying the injection current are counterbalanced in order to maintain the optical length of the Fabry-Perot resonator constant. The laser oscillation frequency (wavelength) by the Fabry-Perot resonator can therefore be maintained constant.

The above will be described further in detail referring to FIGS. 6a through 6f. The first electrode 411 is supplied with a DC bias current of 35 mA (which is about 1.8 times the oscillation threshold current) and a sinusoidal modulation signal current having a modulation frequency of 100 MHz and a peak-to-peak value of about 10 mA. The change $\Delta N_1$ in the carrier concentration of the active layer in the first optical waveguide section 403 varies in a manner that the carrier concentration reaches its peak at the phase about 90° advanced from the phase where the modulation signal current $\Delta i_1$ reaches its peak, as shown in FIG. 6b. Substantially following the pattern of the carrier concentration changes $\Delta N_1$, as shown in FIG. 6c, the refractive index of the first optical waveguide section will change in a manner to make the refractive index minimum at a phase where the carrier concentration is a maximum. The refractive index change $\Delta n_1$ at the first waveguide section is about $10^{-5}$ at its peak and the refractive index reaches a maximum at the phase about 90° delayed from the phase where the modulation signal current $\Delta i_1$ is a maximum. As shown in FIG. 6d, a control signal voltage $\Delta v_2$ having a peak-to-peak value of about 3.0 volts, and having a frequency of 100 MHz is fed as shown in FIG. 6d to the second electrode 412 together with a constant reverse bias voltage of about 2 volts in a manner that it reaches a maximum at the phase 90° advanced from the phase said modulation signal current $\Delta i_1$ is a maximum. The change in refractive index in the second optical waveguide section is determined mainly by electro-optic effect and, therefore, is scarcely affected by carrier concentration. The change in the refractive index in the second optical waveguide section is a maximum when the change $\Delta E_2$ in the electric field intensity within the depletion layer shown in FIG. 6e is a maximum. The change in the electric field $\Delta E_2$ almost reaches its peak when the reverse bias voltage due to the control signal voltage $\Delta v_2$ is a maximum. As the capacity of the depletion layer region induced by the reverse bias voltage is small, the electric field intensity $\Delta E_2$ will change substantially without phase difference against the changes in the control signal voltage $\Delta v_2$ at such a low frequency as 100 MHz. Refractive index change $\Delta n_2$, therefore, reaches a maximum in the second optical waveguide section when the control signal voltage $\Delta v_2$ peak. The maximum value of the refractive index change $\Delta n_2$ is larger than the maximum value in the refractive index change of the first optical waveguide section by a ratio of approximately 1:4 which is the ratio of length of the second optical waveguide section to the first optical waveguide section.

Utilizing the relation in intensity and phase between the modulation signal current $\Delta i_1$ and control signal voltage $\Delta v_2$, the change in optical length between the first and the second optical waveguide sections are compensated so as to maintain the resonator length as a whole substantially constant.

A brief explanation will now be given concerning the fabrication method of the semiconductor laser used in the second embodiment referring to FIG. 5. A GaAs substrate 401 of n-type having (001) on the surface is first prepared. By the liquid phase epitaxial growth method, a first cladding layer 402 of n-type Al$_{x1}$Ga$_{1-x1}$As (x$_1$=0.3), a first optical guide section 403 of nondoped GaAs, a second cladding layer 404 of p-type Al$_{y1}$Ga$_{1-y1}$As (y$_1$=0.3) and a contact layer 405 of p$^+$-type GaAs are consecutively grown on the substrate. Using SiO$_2$ as a mask, the substrate is locally etched to the depth reaching the first cladding layer 402 to remove a half the surface of thus grown layers 403 to 405. The selective etching is made in such a way that the plane orientation of the side face of the step becomes (01$\bar{1}$). A third cladding layer 406 of p-type Al$_{x2}$Ga$_{1-x2}$As (x$_2$=0.3), a second optical waveguide section 407 of p-type GaAs, and a fourth cladding layer 408 of n-type Al$_{y2}$Ga$_{1-y2}$As (y$_2$=0.3) are consecutively grown. The position of the boundary between the first optical waveguide section 403 and the second cladding layer 404 is made substantially the same height from the crystal growth plane of the substrate 401 as the position of the boundary between the second optical waveguide section 407 and the fourth cladding layer 408. The SiO$_2$ is then removed. Stripes of SiO$_2$ which extend in the direction of <00$\bar{1}$> are newly formed. Using the stripes as a mask, the substrate is locally etched to reach the third cladding layer 406 so as to streak the first optical waveguide section 403 and the second optical waveguide section 407. An embedding layer 409 comprising a high-resistance Al$_{x3}$Ga$_{1-x3}$As (x$_3$=0.3) is newly grown on the portion where the crystal has been removed by etching for streaking as aforementioned.

SiO$_2$ in the form the of stripes is finally removed to form respective electrodes 410 through 412.

Referring to the attached drawings, the second embodiment was described in the foregoing statement. Although a GaAs system was used as the composition of the semiconductor laser, it is axiomatic that the composition is not limited to the above but may be a InGaAsP system or PbSaTe system.

Although the dopants used in the third cladding layer 406, the second optical waveguide section 407 and the fourth cladding layer 408 are respectively p-type, p-type and n-type in the semiconductor used in the second embodiment, they may be inverted to be n-type, n-type and p-type, and a reverse bias voltage may be applied to the P-N junction formed by these layers.

An n-type substrate is used as a growth substrate in the above embodiment, but a p-type substrate may be used so that p-type and n-type are inverted in the dopant in respective crystal growth layers.

The second embodiment has the following advantages: As the carrier concentration can be kept low in the second optical waveguide section, the absorption loss is small on that region. As the electro-optical effect is utilized, the free-carrier-density-dependent refractive index change is not necessarily used and therefore a bias current below the oscillation threshold current density is not required to be fed to the second optical waveguide section in the first embodiment. This offers makes the device design applicable to semiconductors having an extremely low oscillation threshold. Further, the refractive index control in the second optical waveguide is responsive at fast modulation.

Although the semiconductor laser diode used in the first and second embodiment has a Fabry-Perot type resonance cavity, it is by no means limited to that and may be of another type such as the distributed feed back type.

By utilizing a semiconductor laser device thus obtained, oscillation frequency can be stabilized even if the injection current is modulated in order to modulate laser beam intensity, thereby further expanding the scope in optical systems where the semiconductor laser is applicable.

What is claimed is:

1. A frequency-stabilized laser diode arrangement comprising:
   modulation means for generating a modulation signal;
   stimulation means, responsively connected to said modulation means, for generating a stimulation signal in accordance with said modulation signal;
   first optical waveguide means, responsively connected to said stimulation means, for generating a light beam in response to said stimulation signal; and
   compensating means, responsively connected to said modulation means, for defining with said first optical waveguide means an optical path for said light beam, for compensating changes in an effective length of a first part of said optical path in said first optical waveguide means induced by said stimulation signal and thus for maintaining an effective length of the entire optical path substantially constant wherein said compensating means comprises:
   control means, responsively connected to said modulation means, for generating a control signal having a predetermined phase with respect to said modulation signal; and
   second optical waveguide means, formed integrally with said first waveguide means, and responsively connected to said control means, for varying an effective path length of a second part of said optical path in said second optical waveguide means in response to said control signal.

2. The frequency-stabilized laser diode arrangement of claim 1, wherein said control means comprises;
   current phase-shifter means responsively connected to said modulation means for phase-shifting the variation in current of said modulation signal with time by a predetermined amount to generate a current phase-shifted signal;
   current means for producing a constant current signal; and
   mixing circuit means, electronically connected to said current phase-shifter means, said current means, and said second optical waveguide means, for mixing said current phase-shift signal and said constant current signal to generate said control signal,
   and wherein said second optical waveguide means is structured to vary the carrier density along said second part of said optical path in response to said control signal.

3. The frequency-stabilized laser diode arrangement of claim 1, wherein said control means comprises:
   a voltage phase-shifter means, responsively connected to said modulation means, for phase-shifting the variation in voltage of said modulation signal with time by a predetermined amount to generate a voltage phase-shifted signal;
   voltage means for producing a constant voltage signal; and
   mixing circuit means, electrically connected to said voltage phase-shifter means, said voltage means and said second optical waveguide means, for mixing said voltage phase-shifted signal and said constant voltage signal to generate said control signal,
   and wherein said second optical waveguide is structured to electro-optically vary the effective path length of said second part of said optical path.

4. A method of frequency stabilizing a laser diode stimulated by a signal derived from a modulation signal to produce a beam along an optical path comprising the steps of:
   (a) arranging an extension of said optical path by forming a second waveguide section including said extension of said optical path integrally with said laser diode; and
   (b) compensating changes in an effective length of said optical path by inducing compensating changes in an effective length of said extension of said optical path, said compensating step including applying a current signal to said second waveguide section to increase a carrier density in said second waveguide section wherein said current signal is derived by current phase-shifting said modulation signal to produce a current phase-shifted signal and by mixing said current phase-shifted signal with a constant current signal.

5. A method of frequency stabilizing a laser diode stimulated by a signal derived from a modulation signal to produce a beam along an optical path comprising the steps of:
   (a) arranging an extension of the optical path by forming a second waveguide section including said extension of said optical path integrally with said laser diode; and (b) compensating changes in an effective length of said optical path by inducing compensating changes in an effective length of said extension of said optical path, by applying a voltage signal to said second waveguide section to electro-optically induce a change in the refractive index along said extension, said voltage signal derived by voltage phase-shifting said modulation signal to produce a voltage phase-shifted signal and by mixing said voltage phase-shifted signal with a constant voltage signal.

* * * * *